(12) United States Patent
Meng et al.

(10) Patent No.: US 8,722,454 B2
(45) Date of Patent: May 13, 2014

(54) METHOD FOR MANUFACTURING ORGANIC ELECTRONIC COMPONENT HAVING SALT COMPOUND

(71) Applicants: Hsin-Fei Meng, New Taipei (TW); Hao-Wu Lin, Hsinchu County (TW); Sheng-Fu Horng, Kaohsiung (TW); Hsiao-Wen Zan, Hsinchu County (TW); Hao-Wen Chang, Taoyuan County (TW); Yu-Fan Chang, Hsinchu County (TW); Yu-Chian Chiu, Taichung (TW)

(72) Inventors: Hsin-Fei Meng, New Taipei (TW); Hao-Wu Lin, Hsinchu County (TW); Sheng-Fu Horng, Kaohsiung (TW); Hsiao-Wen Zan, Hsinchu County (TW); Hao-Wen Chang, Taoyuan County (TW); Yu-Fan Chang, Hsinchu County (TW); Yu-Chian Chiu, Taichung (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 13/668,451

(22) Filed: Nov. 5, 2012

(65) Prior Publication Data

US 2014/0045298 A1    Feb. 13, 2014

(30) Foreign Application Priority Data

Aug. 8, 2012  (TW) .............................. 101128684 A

(51) Int. Cl.
*H01L 51/40*    (2006.01)

(52) U.S. Cl.
USPC .......................................................... 438/99

(58) Field of Classification Search
USPC .......................................................... 438/99
See application file for complete search history.

(56) References Cited

U.S. PATENT DOCUMENTS 5,937,272 A * 8/1999 Tang ................................ 438/30
2011/0284831 A1* 11/2011 Kaiser et al. .................... 257/40
2012/0181530 A1* 7/2012 Funyuu et al. .................. 257/40

FOREIGN PATENT DOCUMENTS

DE  WO 2010/102706 A1 * 9/2010
JP  WO 2011/040531 A1 * 4/2011 ............. C08G 61/12

OTHER PUBLICATIONS

G. Parthasarathy et al., Lithium Doping of Semiconducting Organic Charge Transport Materials, J. Appl. Phys. vol. 89, No. 9 4986-4992 (2001).*

* cited by examiner

*Primary Examiner* — Anthony Ho
(74) *Attorney, Agent, or Firm* — Hershikovitz & Associates, PLLC; Abe Hershkovitz

(57) ABSTRACT

A method for manufacturing an organic electronic component is provided. The method includes steps of providing a substrate and an organic material; coating the organic material onto the substrate; heating the substrate to form a first carrier transport layer; doping a material having a metal ion to an organic solvent to form an organic solution; and applying the organic solution onto the first carrier transport layer to form a second carrier transport layer.

20 Claims, 8 Drawing Sheets

METHOD FOR MANUFACTURING ORGANIC ELECTRONIC COMPONENT HAVING SALT COMPOUND

CROSS-REFERENCE TO RELATED APPLICATION AND CLAIM OF PRIORITY

The application claims the benefit of the Taiwan Patent Application No. 101128684, filed on Aug. 8, 2012, in the Taiwan Intellectual Property Office, the disclosures of which are incorporated herein in their entirety by reference.

FIELD OF THE INVENTION

The present invention relates to a device and method for manufacturing an electronic component, and more particularly to a device and method for manufacturing an organic electronic component.

BACKGROUND OF THE INVENTION

In recent years, due to the properties of the low-temperature process, light weight and simple preparation of the organic material, the development of the organic component, such as the Organic Light-Emitting Diodes (OLED), Organic Thin-Film Transistor (OTFT) and Organic Solar Cell, has been paid attention thereto, wherein the development of the OLED is the fastest. It can be observed that the development of the OLED has been mature since the technology thereof has progressed from the early single-color passive matrix display to the polymer full-color active display.

Compared with the small-molecule Light-Emitting Diode, the Polymer Organic Light-Emitting Diode (PLED) is more competitive in various applications due to its low-cost solution process. Currently, the most common process of the PLED is the spin coating. However, the rate of material used is merely 5%, and the yield for manufacturing the photoelectric element with a big area is extremely low.

Furthermore, it is hard to manufacture the organic electronic component with a multilayer structure by the spin coating since the solvent for the second layer would dissolve the first layer. Thus, there are two main processes for manufacturing the organic film transistor, including the evaporation and solution processes. The organic electronic component with a multilayer structure is mainly manufactured by the evaporation process, which has a high-cost problem and is also uneasy to manufacture the element with a big area.

Please refer to FIG. 1, which shows an organic electronic component 10 in the prior art. The organic electronic component 10 in the prior art includes a cathode 11, an hole injection layer 13 and a film layer 12. The film layer 12 includes a hole transport layer 122, an active layer 123 and an electron transport layer 124. When the active layer 123 includes a luminous material, the organic electronic component 10 is an organic molecular light-emitting component 14. The dotted line 15 of the film layer 12 represents a first electron injection barrier of an electron 125 from the cathode 11 to the active layer 123. The higher the position above the dotted line 15 is, the higher the energy level is. The lower the position below the dotted line 15 is, the lower the energy level is. Typically, the first electron injection barrier is about LUMO 2.8 EV (electron volt). In the organic molecular light-emitting component 14, the electron 125 and hole 126 can both be called the carrier. The electron 125 with a higher energy level at the cathode 11 passes through the electron transport layer 124 to the active layer 123. At this time, the active layer 123 can also be called the luminous layer. The hole 126 with a lower energy level at the hole injection layer 13 passes through the hole transport layer 122 to the active layer 123. The recombination is performed for the electron 125 and the hole 126 in the active layer 123. The electron 125 in the conductive band with a higher energy level returns to the conductive band with a lower energy level to be recombined with the hole 126, which releases energy in the form of light. Thus, the light-emitting efficiency of the active layer 123 relates to the recombining number of the electron 125 with the hole 126. However, the transmission mobility of the electron 125 in the organic material is smaller than that of the hole 126, resulting in the reduction of the recombining efficiency in the active layer 123. Therefore, it is expected to enhance the transmission rate of the electron in the electron transport layer 124, and reduce the energy barrier from the luminous layer 123 to the cathode 11 so as to reduce the operating voltage and enhance the light-emitting efficiency.

At the same time, if the solution process can be applied to manufacture the organic electronic component with a multilayer structure, the production cost thereof will be greatly reduced. This is favorable for the commercialization and mass production for the organic electronic component.

SUMMARY OF THE INVENTION

In accordance with an aspect of the present invention, a method for manufacturing an organic electronic component is provided. The method includes steps of providing a substrate and an organic material; coating the organic material onto the substrate; heating the substrate to form a first carrier transport layer; doping a material having a metal ion to an organic solvent to form an organic solution; and applying the organic solution onto the first carrier transport layer to form a second carrier transport layer.

In accordance with another aspect of the present invention, a method for manufacturing an organic electronic component is provided. The method includes steps of (a) providing a first carrier transport layer and an organic solvent; (b) doping a material having a metal ion to the organic solvent to form an organic solution uniformly; and (c) applying the organic solution onto the first carrier transport layer to form a second carrier transport layer.

In accordance with a further aspect of the present invention, a method for manufacturing an organic electronic component is provided. The method includes steps of (a) providing a first carrier transport layer; (b) providing an organic solution including a metal ion; and (c) coating the organic solution onto the first carrier transport layer to form a second carrier transport layer.

The above objects and advantages of the present invention will become more readily apparent to those ordinarily skilled in the art after reviewing the following detailed descriptions and accompanying drawings, in which:

DETAILED DESCRIPTION OF THE PREFERRED EMBODIMENTS

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 1:
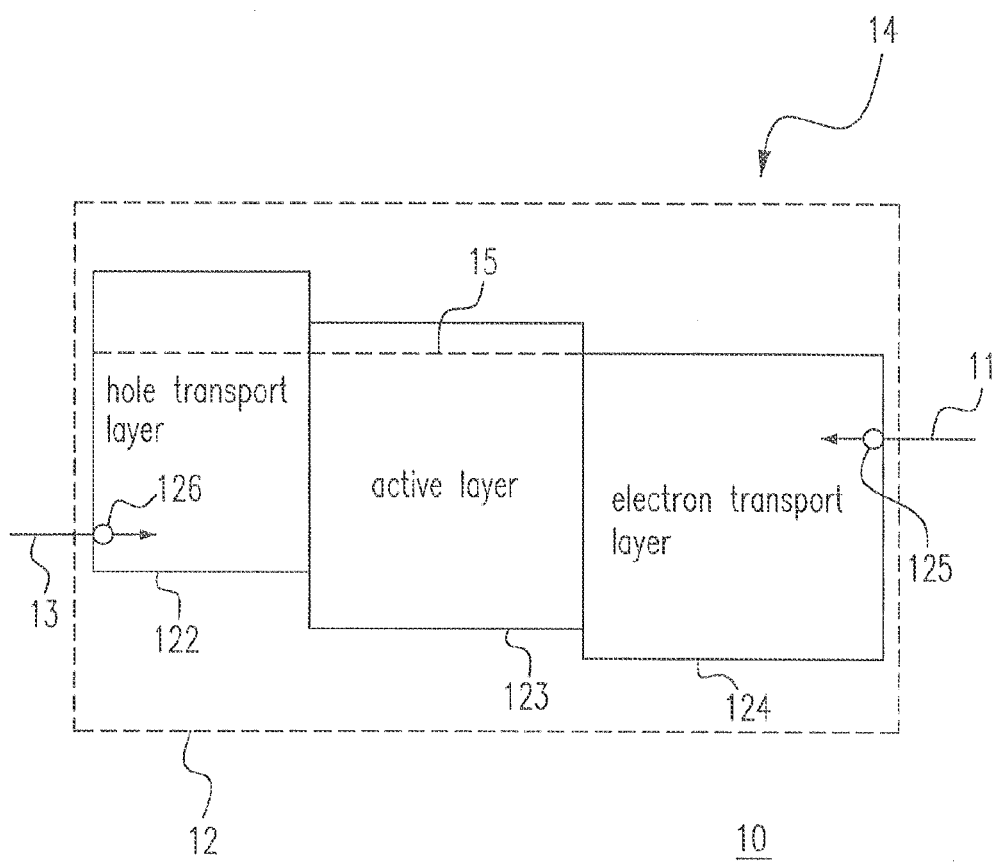
FIG. 1 shows an organic electronic component in the prior art.
Figure 2:
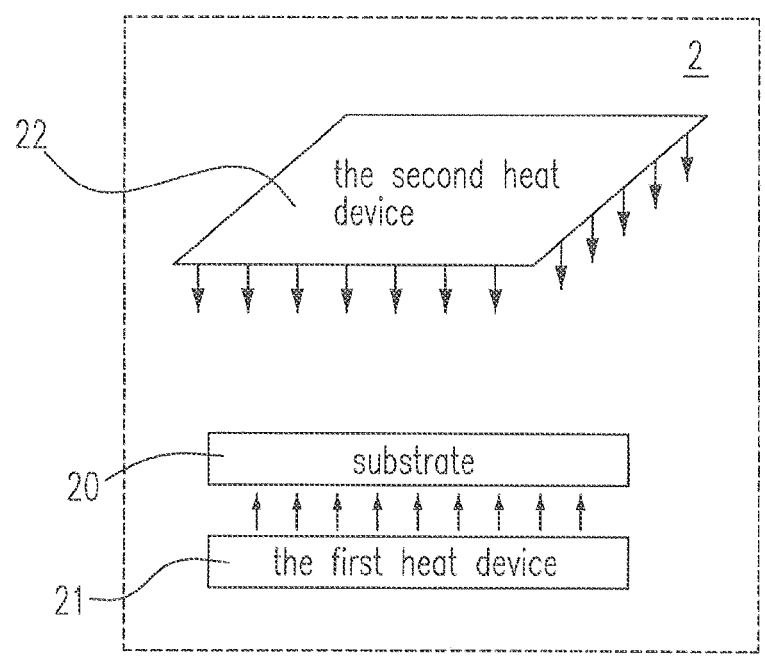
FIG. 2 shows a device for manufacturing an organic electronic component according to an embodiment of the present invention.

Please refer to FIG. 2, which shows a device 2 for manufacturing an organic electronic component according to an embodiment of the present invention. The device 2 includes a first heat device 21 and a second heat device 22, wherein the position of the second heat device is different from that of the first heat device. In FIG. 2, the first heat device 21 is disposed under a substrate 20, and the second heat device 22 is disposed above the substrate 20.

It should be understood that the disposition way for the first heat device 21 and the second heat device 22 is not limited to the illustration of FIG. 2. The second heat device 22 can be disposed at any positions, except for the position of the first heat device 21, as long as the heat source provided thereby is sufficient to reach the effect of heating in the device 2. Besides, the first heat device 21 is also not limited to be disposed under the substrate 20, which can be disposed at any positions, as long as the heat source provided thereby is sufficient to reach the effect of heating the substrate 20.

For example, when the first heat device 21 is disposed under the substrate 20, the second heat device 22 can be disposed above or around the substrate 20. Otherwise, the first heat device 21 and the second heat device 22 can be disposed above or under the substrate 20 at the same time, with different horizontal positions or different plane coordinate positions.

For example, the first heat device 21 or the second heat device 22 can be a hot plate, a hot-air generator, an oven or an infrared-ray heating device, etc.

In FIG. 2, the substrate 20 can be divided into a first portion and a second portion (not shown), which are heated by the first heat device 21 and the second heat device 22 respectively. For example, the first portion is the lower surface of the substrate 20, and the second portion is the portion of the substrate 20 excluding the first portion. However, in the practical operation, since the first heat device 21 and the second heat device 22 both can continuously provide the heat source in the manufacturing process, the first heat device 21 can assist to heat the second portion, and the second heat device 22 can also heat the first portion and the second portion simultaneously.

Figure 3:
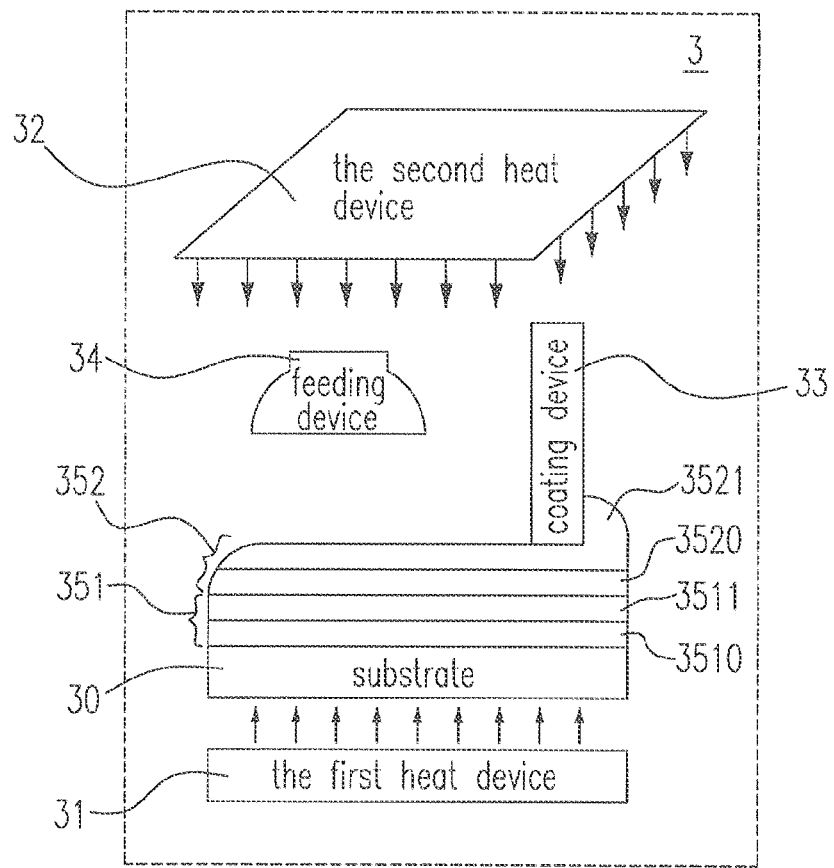
FIG. 3 shows a device for manufacturing an organic electronic component according to another embodiment of the present invention.

Please refer to FIG. 3, which shows a device 3 for manufacturing an organic electronic component according to another embodiment of the present invention. The device 3 includes a first heat device 31, a second heat device 32, a coating device 33, and a feeding device 34. The substrate 30 is heated by the first heat device 31. The film layer 351 of the organic electronic component is coated on the substrate 30 by the coating device 33.

In FIG. 3, the film layer 351 of the organic electronic component includes a hole transport layer 3510 and an active layer 3511. Firstly, a first organic material and an organic solvent are mixed by the feeding device 34 to form a first organic solution. For example, the feeding device 34 can be a pipette with a precisely controlled liquid capacity, which has a feeding precision of a micro Liter (μL) level. The first organic material serves as the material of the hole transport layer 3510. Then, the first organic solution is coated on the substrate 30 by the coating device 33, and the first heat device 31 is used to heat the substrate 30 to form the hole transport layer 3510. For example, the coating device 33 is a blade. The first heat device 31 can evaporate the first organic solvent fast, which is favorable for the formation of a dry film layer. The dry film layer can bear the follow-up wet film layer coated thereon so that the two liquid film layers will not dissolve with each other. Typically, the first heat device 31 heats the substrate 30 to 120° C. If the temperature is too high, the dry organic film layer would be softened, melted and decomposed. If the temperature is too low, the first organic material would be decomposed before the complete evaporation of the first organic solvent.

Next, the first heat device 31 continues heating at a constant temperature. A second organic material and a second organic solvent are mixed by the feeding device 34 to form a second organic solution on the dried hole transport layer 3510. The second organic material serves as the material of the active layer 3511. The organic electronic component can serve as an organic molecular light-emitting component, an organic molecular transistor, an organic solar cell or an organic light detector. The active layer 3511 can serve as a light-emitting layer or a light-adsorbing layer. After the hole transport layer 3510 is dried, the second organic solution is coated on the hole transport layer 3510 by the coating device 33, and the second heat device 32 is used for heating to form the active layer 3511.

The first organic solvent and the second organic solvent both can be highly volatile solvents such as ethyl ether, methanol, formaldehyde, ethanol or acetone, etc. The first organic solvent and the second organic solvent can be different.

The first heat device 11 or the second heat device 12 can be a hot plate, a hot air generator, an oven or an infrared-ray heating device, etc.

The method for manufacturing the film layer 352 of the organic electronic component resembles the above-mentioned method for manufacturing the film layer 351 of the organic electronic component. The difference therebetween is that the film layer 352 of the organic electronic component includes the first electron transport layer 3520 and the second electron transport layer 3521, wherein the first electron transport layer 3520 is manufactured by a third organic solution formed by a third organic material and a third organic solvent. However, the second electron transport layer 3521 is manufactured by a fourth organic solution formed by a fourth organic solvent and the mix of a third organic material with a fourth material. For example, the third organic material can be a TPBi material. Since the third organic material is doped with the fourth material, the second electron transport layer 3521 with a higher conductivity is formed. The electron mobility of the second electron transport layer 3521 is larger than that of the first electron transport layer 3520. The second electron transport layer 3521 decreases the electron injection barrier that the electron of the first electron transport layer 3520 is injected to the active layer 3511, thereby decreasing the operating voltage of the organic electronic component. The fourth material can be an easily dissociable salt including a metal ion. For example, the metal ion includes a Lithium ($Li^+$) ion, a Cesium ($Cs^+$) ion or the combination thereof. The easily dissociable salt includes a metal salt, a carbonate, an acetate, an organic salt or the combination thereof, such as the Lithium carbonate ($Li_2CO_3$), the Cesium carbonate ($Cs_2CO_3$) or the combination thereof.

Firstly, the first heat device 31 is used to heat the substrate 30. The heating temperature for the substrate 30 can be set according to types of the third and the fourth organic materials and other process conditions. For example, the temperature range of the substrate 30 can be controlled in the range of 20-150° C. The feeding device 34 mixes the third organic material with the third organic solvent to form the third organic solution, and then the third organic solution is coated on the film layer 351 of the organic electronic component by the coating device 33. Besides, the first heat device is utilized to heat the substrate 30 to form the first electron transport layer 3520.

Next, the first heat device 31 continues heating at a constant temperature. The third organic material is doped with the fourth material on the first electron transport layer 3210 by the feeding device 34, which is also used to add the fourth solvent to mix uniformly to form the forth organic solution. After the first electron transport layer 3520 is dried, the fourth organic solution is coated on the first electron transport layer 3520 by the coating device 33, and the second heat device 32 is used to form the second electron transport layer 3521.

In the above-mentioned embodiment, the first electron transport layer 3520 is doped with other ions with a good conductivity to form the second electron transport layer 3520 with a higher electron mobility. The same embodiment can also be applied to the hole transport layer 3510, i.e. the carrier transport layer.

In the above-mentioned embodiment, the order of manufacturing films is not limited to the hole transport layer 3510 as the first layer, which can also be changed to the electron transport layer 3520 as the first layer.

Figure 4A:
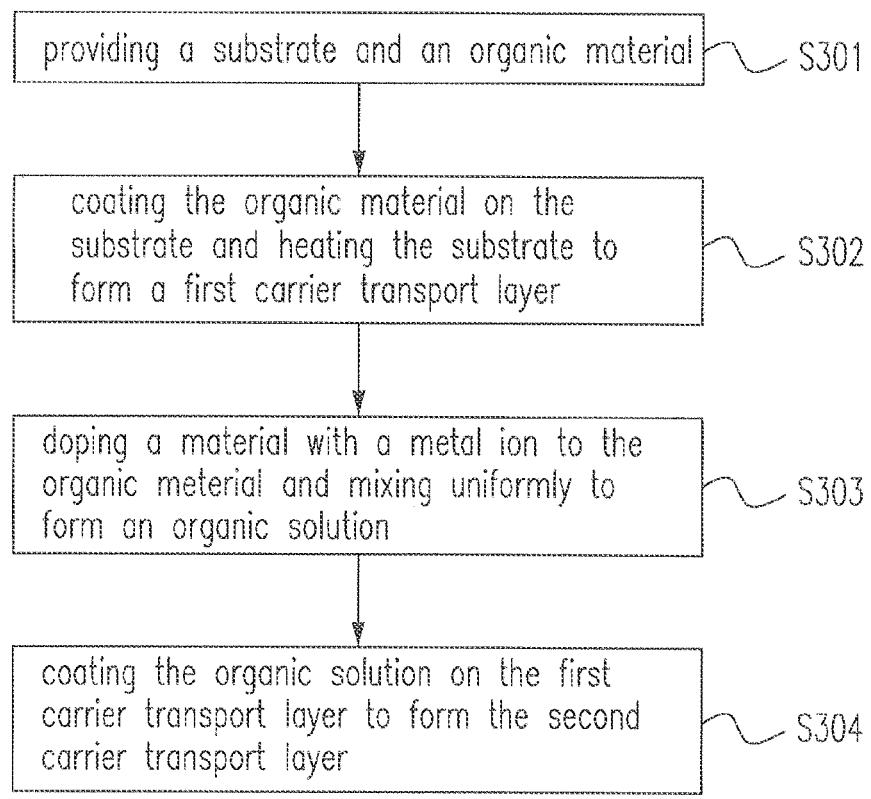
FIG. 4(a) shows a method for manufacturing an organic electronic component according to an embodiment of the present invention.

Please refer to FIG. 4(a), which shows a method for manufacturing an organic electronic component according to an embodiment of the present invention. The method includes the following steps:

Step S301: providing a substrate and an organic material;

Step S302: coating the organic material on the substrate, and heating the substrate to form a first carrier transport layer;

Step S303: doping a material with a metal ion to the organic material and mixing uniformly to form an organic solution; and Step S304: coating the organic solution on the first carrier transport layer to form a second carrier transport layer.

In the above embodiment, the second heat device 32 is mainly used to heat the film material of the organic electronic component coated on the substrate 30 to form the film layer 351 or 352 of the organic electronic component. Similarly, besides heating the substrate 30, the first heat device 31 also assists to heat the film material of the organic electronic component on the substrate 30 to accelerate the evaporation of the first, the second, the third and the fourth solvents so as to form the film layer 351 or 352 of the organic electronic component.

In the above embodiment, the feeding device 34 can control the accuracy of the solution to 0.5 µL so as to achieve the material usage rate of nearly 100%, and prevent the redundant solution on the active layer 3511 from dissolving the hole transport layer 3510, or prevent the redundant solution on the second electron transport layer 3521 from dissolving the first electron transport layer 3520, or prevent the redundant solution on the first electron transport layer 3520 from dissolving the active layer 3511. When the coating is performed by the coating device 33, the solvent is accumulated in front of the coating device 33 in the coating direction. At this time, the feeding frequency can be adjusted according to the solution accumulation in front of the coating device 33.

Figure 4B:
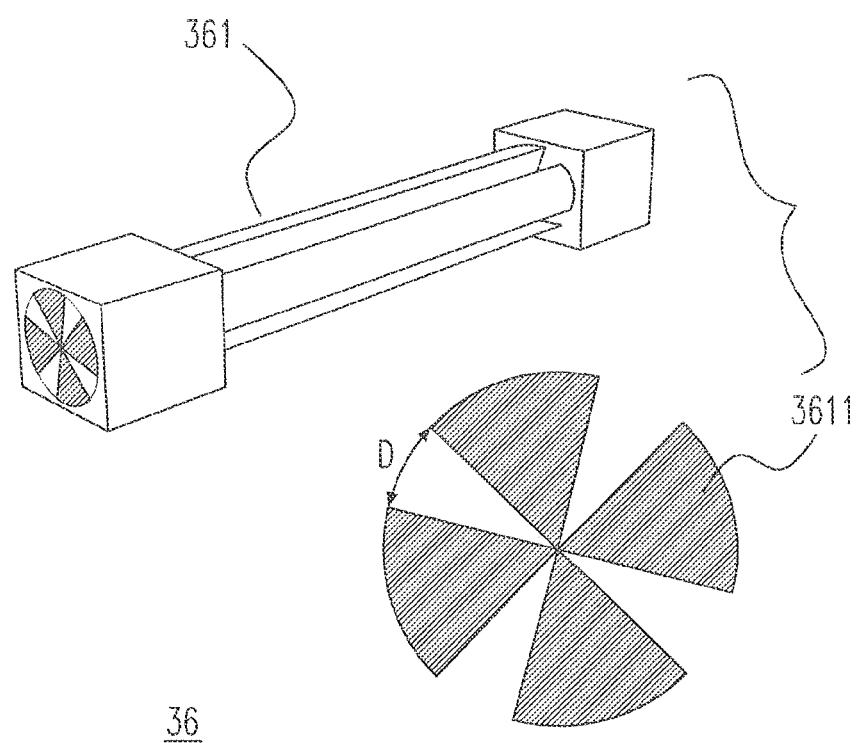
FIG. 4(b) shows a coating device according to an embodiment of the present invention.

In the above embodiment, for example, the coating device 33 can be a blade or any other tools which can coat the organic and oxide semiconductor material onto the substrate 30 to form a uniform film. Please refer to FIG. 4(b), which shows a coating device 33 according to an embodiment of the present invention. In FIG. 4(b), the coating device 33 is a blade 36 in a dumbbell shape, and includes a cylindrical rolling body 361. The cylindrical rolling body 361 includes a plurality of fan-shaped cylindrical bodies 3611, wherein there is a largest slot pitch D, e.g. 10-500 µm, between every two adjacent fan-shaped cylindrical bodies so that the organic and oxide semiconductor wet film of 10-500 µm can be coated. For example, when the rolling length of the blade 36 is 1 centimeter in the coating process, the accumulation is 0.5-5 µL.

In the above embodiment, the temperature control can be performed for the solution which has not been used yet; for example, the heating temperature range therefor is 20-150° C.

In the above embodiment, for example, the substrate 20 or 30 is an Indium Tin Oxide (ITO) substrate.

Figure 5:
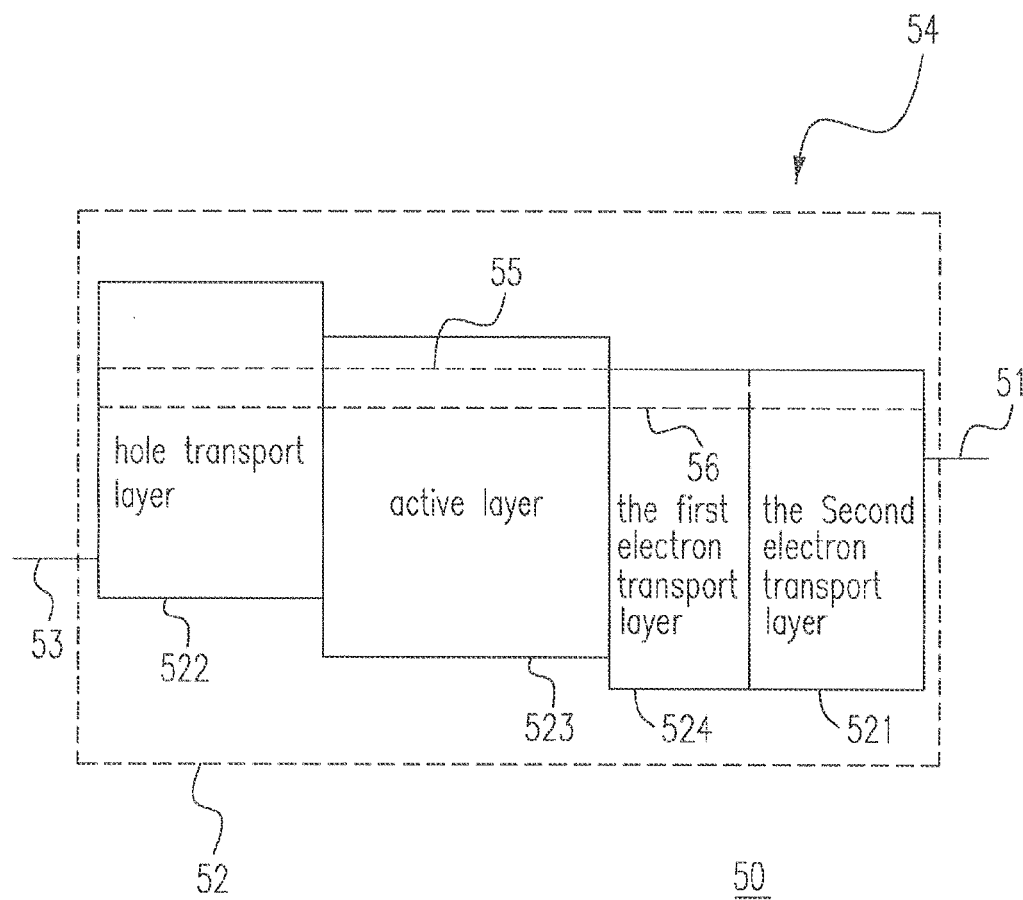
FIG. 5 shows an organic electronic component according to an embodiment of the present invention.

Please refer to FIG. 5, which shows an organic electronic component 50 according to an embodiment of the present invention. The organic electronic component 50 includes a cathode 51, a hole injection layer 53, an active layer 523, an electron transport layer 524, and a second electron transport layer 521. The cathode 51 and the hole injection layer 53 can also be manufactured by the above-mentioned solution process. When the active layer 523 includes a light-emitting material, the organic electronic component 50 is an organic molecular light-emitting component 54. In the film layer 52, the dotted line 55 represents the first electron injection barrier of the conventional organic electronic component 10. The higher the position above the dotted line 55 is, the higher the energy level is. The lower the position below the dotted line 55 is, the lower the energy level is. The dotted line 56 represents a second electron injection barrier of the organic electronic component 10 in the present invention. This shows that in FIG. 5, the second electron injection barrier of the electron from the cathode 51 to the active layer 523 is decreased, which is typically smaller than LUMO 2.8 eV. This is favorable to decrease a breakover voltage of the organic electronic component 50.

The second electron transport layer 521 is doped with an easily dissociable compound, such as a dissociable salt. The dissociable salt includes the Lithium carbonate ($Li_2CO_3$), the Cesium carbonate ($Cs_2CO_3$) or the combination thereof. The metal ion dissociated from the dissociable salt (such as the $Li^+$ or $Cs^+$) increases the conductivity of the original electron transport layer without doping the metal ion, which enables the electron mobility of the second electron transport layer 521 to be larger than that of the first electron transport layer 524. The first electron transport layer 524 has an electron injection barrier. The second electron transport layer 521 is used to reduce the electron injection barrier and the breakover voltage of the organic electronic component 50.

In an embodiment, the materials of the small-molecule organic electronic component 50, the substrate 30, the hole injection layer 53, the hole transport layer 522, the active layer 523, the first electron transport layer 524, the second electron transport layer 521 and the cathode 51 manufactured are the Indium Tin Oxide (ITO), PEDOT(AI4083), TAPC, 26DCzPPy:Ir(mppy)$_3$, TPBi, TPBi doped with the Cesium carbonate (Cs$_2$CO$_3$), Lithium Fluoride (LiF) and Aluminum (Al) respectively.

Figure 6A:
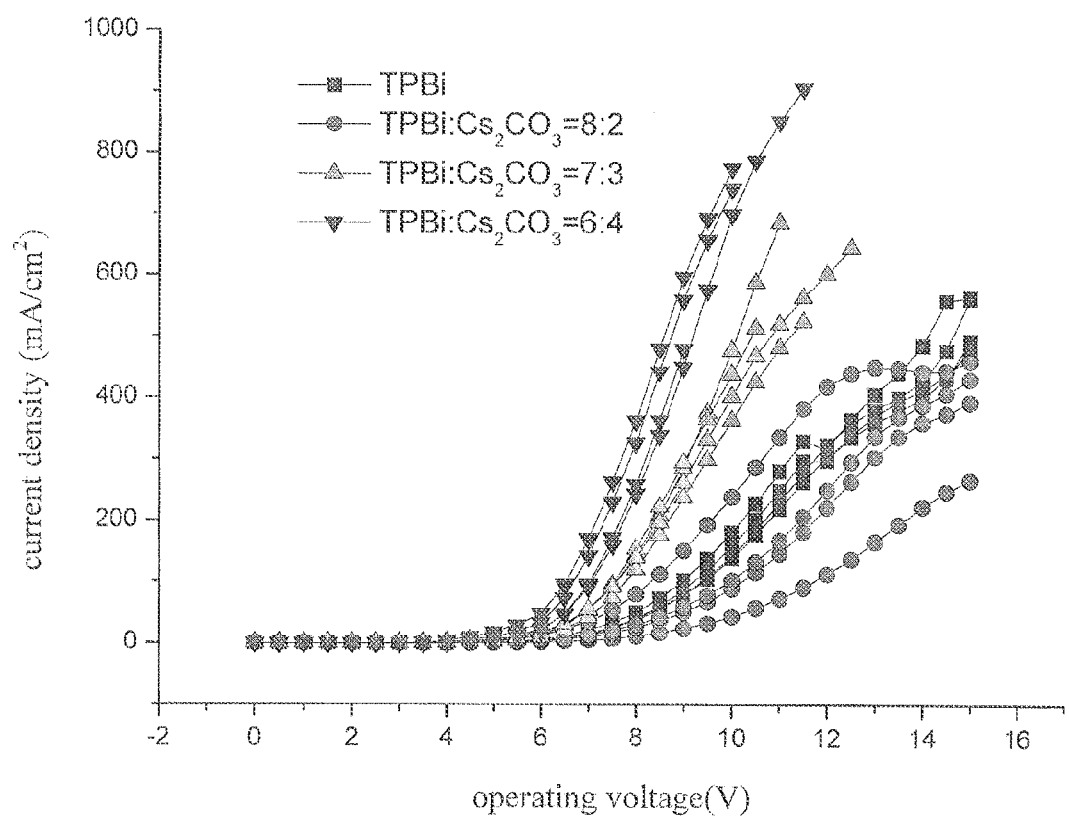
FIG. 6(a) is a diagram showing the operating voltage of the organic electronic component verse the current density thereof according to an embodiment of the present invention.

Please refer to FIG. 6(a), which is a diagram showing the operating voltage of the organic electronic component 50 verse the current density thereof according to an embodiment of the present invention. The x-axis represents the operating voltage of the organic electronic component 50, wherein the unit thereof is volt (V). The y-axis represents the current density of the organic electronic component 50, wherein the unit thereof is milliamp per square centimeters (mA/cm$^2$). When the ratio of the third organic material TPBi to the fourth material Cs$_2$CO$_3$ in the second electron transport layer 521 is 1:0, 8:2, 7:3, and 6:4 respectively, different curves are formed, as shown in FIG. 6(a). It is known from FIG. 6(a) that when the ratio of the third organic material TPBi to the fourth material Cs$_2$CO$_3$ in the second electron transport layer 521 is 6:4, a few current densities have been produced at the operating voltage of 4 V, and the current density at the operating voltage of 6 V is higher than those at other ratios. This represents that the operating voltage of the organic electronic component is reduced.

Figure 6B:
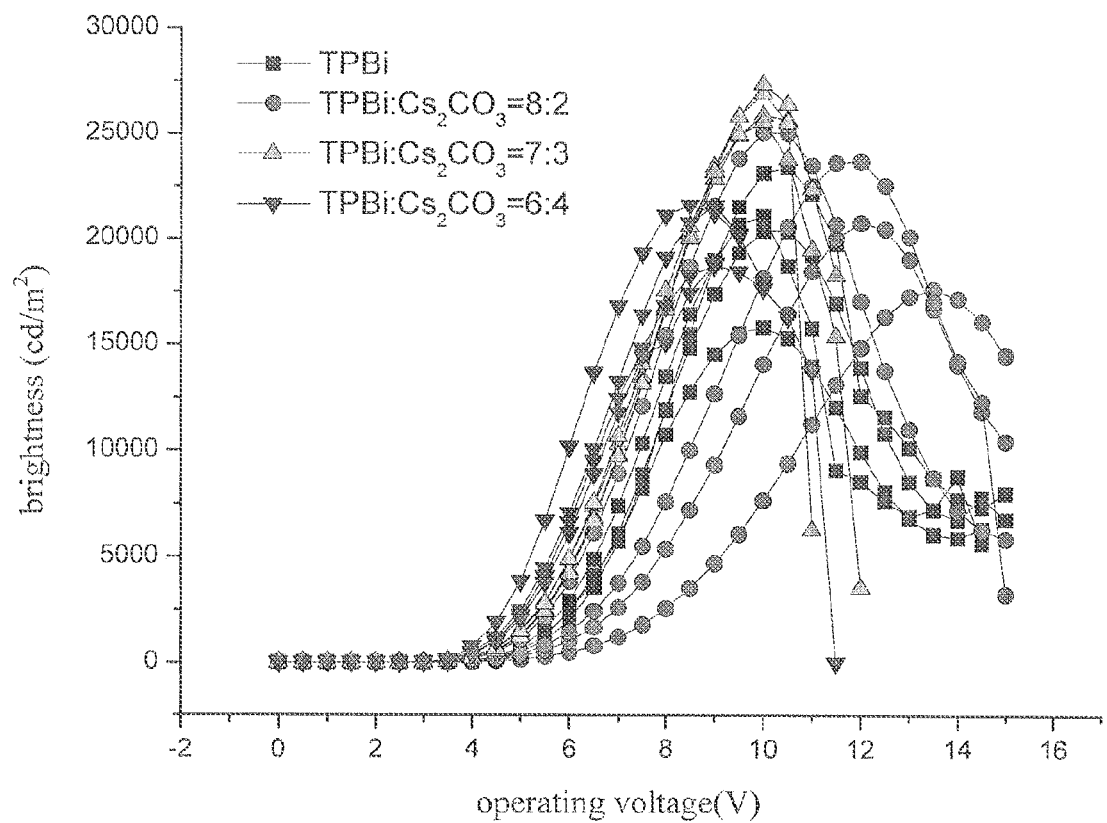
FIG. 6(b) is a diagram showing the operating voltage of the organic electronic component verse the brightness according to an embodiment of the present invention.

Please refer to FIG. 6(b), which is a diagram showing the operating voltage of the organic electronic component 50 verse the brightness according to an embodiment of the present invention. The x-axis represents the operating voltage of the organic electronic component 50, wherein the unit thereof is volt (V). The y-axis represents the brightness of the organic electronic component 50, wherein the unit thereof is candela per square meters (cd/m$^2$). When the ratio of the third organic material TPBi to the fourth material Cs$_2$CO$_3$ in the second electron transport layer 521 is 1:0, 8:2, 7:3, and 6:4 respectively, different curves are formed, as shown in FIG. 6(b). It is known from FIG. 6(b) that when the ratio of the third organic material TPBi to the fourth material Cs$_2$CO$_3$ in the second electron transport layer 521 is 6:4, the brightness of the organic electronic component 50 has been produced at the operating voltage of 4 V, and the brightness of the organic electronic component 50 at the operating voltage of 6-8 V is higher than those at other ratios. This represents that the brightness is still not bad when the operating voltage of the organic electronic component 50 is reduced. The brightness of the organic electronic component 10 with the second electron transport layer 521 is better than that of the organic electronic component 10 without the second electron transport layer 521.

Based on the above, the manufacturing device and method provided by the present invention can manufacture a big-area and uniform organic electronic component with a multilayer structure, thereby successfully reducing the production cost and achieving the commercialization and mass production for the organic electronic component.

Embodiments

1. A method for manufacturing an organic electronic component, comprising steps of:
    providing a substrate and an organic material;
    coating the organic material onto the substrate;
    heating the substrate to form a first carrier transport layer;
    doping a material having a metal ion to an organic solvent to form an organic solution; and
    applying the organic solution onto the first carrier transport layer to form a second carrier transport layer.

2. A method for manufacturing an organic electronic component, comprising steps of:
    (a) providing a first carrier transport layer and an organic solvent;
    (b) doping a material having a metal ion to the organic solvent to form an organic solution uniformly; and
    (c) applying the organic solution onto the first carrier transport layer to form a second carrier transport layer.

3. The method of Embodiment 2, further comprising following steps before the step (a):
    providing a film material including an organic material; and
    providing a first heat source to heat the film material.

4. A method for manufacturing an organic electronic component, comprising steps of:
    (a) providing a first carrier transport layer;
    (b) providing an organic solution including a metal ion; and
    (c) coating the organic solution onto the first carrier transport layer to form a second carrier transport layer.

5. The method of Embodiment 4, further comprising following steps before the step (a):
    providing a substrate;
    providing a first heat source to heat the substrate; and
    disposing a film material on the substrate, wherein the film material includes an organic material.

6. The method of any one of Embodiments 4-5, wherein the first heat source is disposed under the substrate.

7. The method of any one of Embodiments 4-6, wherein the first heat source heats the film material.

8. The method of any one of Embodiments 4-7, wherein the film material is formed to be one of a hole-transport layer and an emitting layer after being heated.

9. The method of any one of Embodiments 4-8, wherein the organic solution is formed by doping a material having the metal ion to an organic solvent, and the first carrier transport layer is formed by heating the film material by a second heat source.

10. The method of any one of Embodiments 4-9, wherein the organic solution includes a solvent, having high volatility.

11. The method of any one of Embodiments 4-10, wherein the film material is heated by the first heat source and the second heat source for facilitating evaporation of the solvent.

12. The method of any one of Embodiments 4-11, wherein the second heat source is disposed at one of above and around the substrate.

13. The method of any one of Embodiments 4-12, wherein the first heat source has a temperature range between 20 and 150° C., and the second heat source has a temperature range between 20 and 200° C.

14. The method of any one of Embodiments 4-13, wherein the first carrier transport layer includes a first electron transport layer, and the second carrier transport layer includes a second electron transport layer.

15. The method of any one of Embodiments 4-14, wherein the second electron transport layer is formed through heating by the first heat source and the second heat source.

16. The method of any one of Embodiments 4-15, wherein the first electron transport layer and the second electron transport layer have the first electron transport rate and the second electron transport rate respectively, and the second electron transport rate is higher than the first electron-transport rate.

17. The method of any one of Embodiments 4-16, wherein the first electron transport layer has an electron injection barrier, and the organic electronic component has a conduction voltage.

18. The method of any one of Embodiments 4-17, wherein the second electron transport layer is used to decrease the electron injection barrier and the conduction voltage.

What is claimed is:

1. A method for manufacturing an organic electronic component, comprising steps of:
   providing a substrate, an organic material having a first organic solvent, a first heating device disposed below the substrate and a hot air generator disposed above the substrate;
   coating the organic material onto the substrate;
   heating the substrate by the first ehating device and the hot air generator to dry the organic material so as to cause the first organic solvent to be evaporated from the organic material to form a first carrier transport layer on the substrate;
   forming an organic solution by dissolving a salt selected from a group consisting of a Lithium carbonate, a Lithium acetate, a Cesium carbonate, a Cesium acetate and a combination thereof in a second organic solvent; and
   applying the organic solution onto the first carrier transport layer to form a second carrier transport layer,
   wherein the first organic solvent is evaporated from the organic material to reduce a dissolution between the organic solution and the first carrier transport layer.

2. The method as claimed in claim 1, wherein each of the first and the second organic solvents is one selected from a group consisting of a formaldehyde, an ethyl ether and a combination thereof, and the first heating device heats the substrate to a constant temperature.

3. A method for manufacturing an organic electronic component, comprising steps of:
   (a) providing a first carrier transport layer and an organic solvent;
   (b) forming an organic solution by mixing the organic solvent with a salt being one selected from a group consisting of a Lithium carbonate, a Lithium acetate, a Cesium carbonate, a Cesium acetate and a combination thereof wherein the organic solution and the salt are mixed uniformly; and
   (c) applying the organic solution onto the first carrier transport layer to form a second carrier transport layer.

4. A method as claimed in claim 3, further comprising following steps before the step (a):
   providing a film material including an organic material;
   providing a first heat source to heat the film material; and
   providing a second heat source being one selected from a group consisting of a hot air generator, an infrared heating device and a combination thereof to facilitate evaporation of the organic solvent within the film material.

5. A method for manufacturing an organic electronic component, comprising steps of:
   (a) providing a first carrier transport layer;
   (b) providing an organic solution including a metal ion being one selected from a group consisting of a Lithium ($Li^+$) ion, a Cesium (Cs+) ion and a combination thereof; and
   (c) coating the organic solution onto the first carrier transport layer to form a second carrier transport layer.

6. A method as claimed in claim 5, further comprising following steps before the step (a):
   providing a substrate;
   providing a first heat source to heat the substrate; and
   disposing a film material on the substrate, wherein the film material includes an organic material.

7. A method as claimed in claim 6, wherein the first heat source is disposed under the substrate.

8. A method as claimed in claim 6, wherein the first heat source heats the film material.

9. A method as claimed in claim 6, wherein the film material is formed to be one of a hole-transport layer and an emitting layer after being heated.

10. A method as claimed in claim 5, wherein the first carrier transport layer is formed by heating the film material by a second heat source, and the second heat source is one selected from a group consisting of a hot air generator, an infrared heating device and a combination thereof 11. A method as claimed in claim 10, wherein the organic solution includes a solvent, having high volatility, and the solvent is one selected from a group consisting of methanol, ethanol, acetone, formaldehyde, ethyl either and a combination thereof.

12. A method as claimed in claim 11, wherein the film material is heated by the first heat source and the second heat source for facilitating evaporation of the solvent.

13. A method as claimed in claim 10, wherein the second heat source is disposed above the substrate.

14. A method as claimed in claim 10, wherein the first heat source has a temperature range between 20 and 150° C., and the second heat source has a temperature range between 20 and 200° C.

15. The method as claimed in claim 10, wherein the first carrier transport layer includes a first electron transport layer, and the second carrier transport layer includes a second electron transport layer.

16. A method as claimed in claim 15, wherein the second electron transport layer is formed through heating by the first heat source and the second heat source.

17. A method as claimed in claim 15, wherein the first electron transport layer and the second electron transport layer have a first electron transport rate and a second electron transport rate respectively, and the second electron transport rate is higher than the first electron transport rate.

18. A method as claimed in claim 15, wherein the first electron transport layer has an electron injection barrier, and the organic electronic component has a conduction voltage.

19. A method as claimed in claim 18, wherein the second electron transport layer is used to decrease the electron injection barrier and the conduction voltage.

20. A method as claimed in claim 5, wherein the method is a solution process.

* * * * *